(12) United States Patent
Ishihara et al.

(10) Patent No.: US 8,350,333 B2
(45) Date of Patent: Jan. 8, 2013

(54) SEMICONDUCTOR DEVICE AND METHOD FOR MANUFACTURING SAME

(75) Inventors: Hanae Ishihara, Kanagawa-ken (JP); Mitsuhiro Noguchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 437 days.

(21) Appl. No.: 12/785,843

(22) Filed: May 24, 2010

(65) Prior Publication Data
US 2010/0295013 A1    Nov. 25, 2010

(30) Foreign Application Priority Data
May 25, 2009 (JP) .................. 2009-125422

(51) Int. Cl.
  *H01L 45/00* (2006.01)
  *H01L 21/8239* (2006.01)
  *H01L 27/105* (2006.01)
(52) U.S. Cl. .............. 257/369; 257/5; 257/E27.081; 257/E21.645; 257/E21.632; 438/210
(58) Field of Classification Search .......... 257/5, 369, 257/379, E21.645, E21.632, E27.081, E45.002; 438/210
See application file for complete search history.

(56) References Cited

U.S. PATENT DOCUMENTS
6,833,594 B2   12/2004 Kitamura
2007/0187776 A1*  8/2007 Sasaki ................ 257/379

FOREIGN PATENT DOCUMENTS
JP    11-238807    8/1999

OTHER PUBLICATIONS
U.S. Appl. No. 12/759,107, filed Apr. 13, 2010, Mitsuhiko Noda, et al.

* cited by examiner

*Primary Examiner* — Benjamin Sandvik
*Assistant Examiner* — Whitney T Moore
(74) *Attorney, Agent, or Firm* — Oblon, Spivak, McClelland, Maier & Neustadt, L.L.P.

(57) ABSTRACT

A semiconductor device according to an embodiment includes: a semiconductor substrate; a resistance element of a first conductivity type formed in one region of the semiconductor substrate; a field effect transistor of a second conductivity type formed in another region of the semiconductor substrate; and a field effect transistor of the first conductivity type formed in still another region of the semiconductor substrate. The resistance element includes: an insulating film formed in an upper layer portion of the semiconductor substrate; and a well of the first conductivity type formed immediately below the insulating film, an impurity concentration at an arbitrary depth position in the well of the first conductivity is lower than an impurity concentration at the same depth position in a channel region of the field effect transistor of the second conductivity type.

17 Claims, 9 Drawing Sheets

PERPENDICULAR DIRECTION
TO SUBSTRATE SURFACE

FIG. 9

SEMICONDUCTOR DEVICE AND METHOD FOR MANUFACTURING SAME

CROSS-REFERENCE TO RELATED APPLICATIONS

This application is based upon and claims the benefit of priority from the prior Japanese Patent Application No. 2009-125422, filed on May 25, 2009; the entire contents of which are incorporated herein by reference.

FIELD

Embodiments described herein relate generally to a semiconductor device and a method for manufacturing the same.

BACKGROUND

Previously, a semiconductor device having a resistance element and a field effect transistor formed on one semiconductor substrate has been developed. For example, JP-A 11-238807 (Kokai) (1999) discloses a technique forming a resistance element using a well formed immediately below an element isolation insulating film.

However, in the technique disclosed in JP-A 11-238807 (1999), independent design is not allowed for a well forming a resistance element and a well forming a channel region of a field effect transistor. Therefore, for example, in case an impurity concentration of the well is reduced to increase a resistivity in order to shrink the resistance element, a resistivity of the well of the field effect transistor also increases and latch-up characteristics are deteriorated. On the other hand, in case the impurity concentration of the well of the field effect transistor is increased and the resistivity is reduced, the resistivity of the resistance element is also reduced and the resistance element size becomes larger.

DETAILED DESCRIPTION

According to an aspect of the invention, there is provided a semiconductor device including: a semiconductor substrate; a resistance element of a first conductivity type formed in one region of the semiconductor substrate; a field effect transistor of a second conductivity type formed in another region of the semiconductor substrate; and a field effect transistor of the first conductivity type formed in still another region of the semiconductor substrate, the resistance element including: an insulating film formed in an upper layer portion of the semiconductor substrate; and a well of the first conductivity type formed immediately below the insulating film, an impurity concentration at an arbitrary depth position in the well of the first conductivity being lower than an impurity concentration at the same depth position in a channel region of the field effect transistor of the second conductivity type.

According to another aspect of the invention, there is provided a method for manufacturing a semiconductor device including: forming an insulating film in an upper layer portion of one region of a semiconductor substrate; implanting impurity into another region with the insulating film not formed of the semiconductor substrate to form a first diffusion region of a first conductivity type in the another region; implanting impurity into still another region with the insulating film not formed of the semiconductor substrate to form a well of a second conductivity type in the still another region; implanting impurity into the one region and the another region to form a well of the first conductivity type immediately below the insulating film and to form a second diffusion region of the first conductivity type in the another region with overlapping the first diffusion region; forming a gate insulating film at least in a portion on the first diffusion regions and at least in a portion of the well of the second conductivity type; forming a gate electrode on the gate insulating film; forming source/drain regions of the second conductivity type in a portion of the first diffusion region; and forming source/drain regions of the first conductivity type in the portion of the well of the second conductivity type.

Embodiments of the invention will now be described with reference to the drawings.

First, a first embodiment is described.

Figure 1:
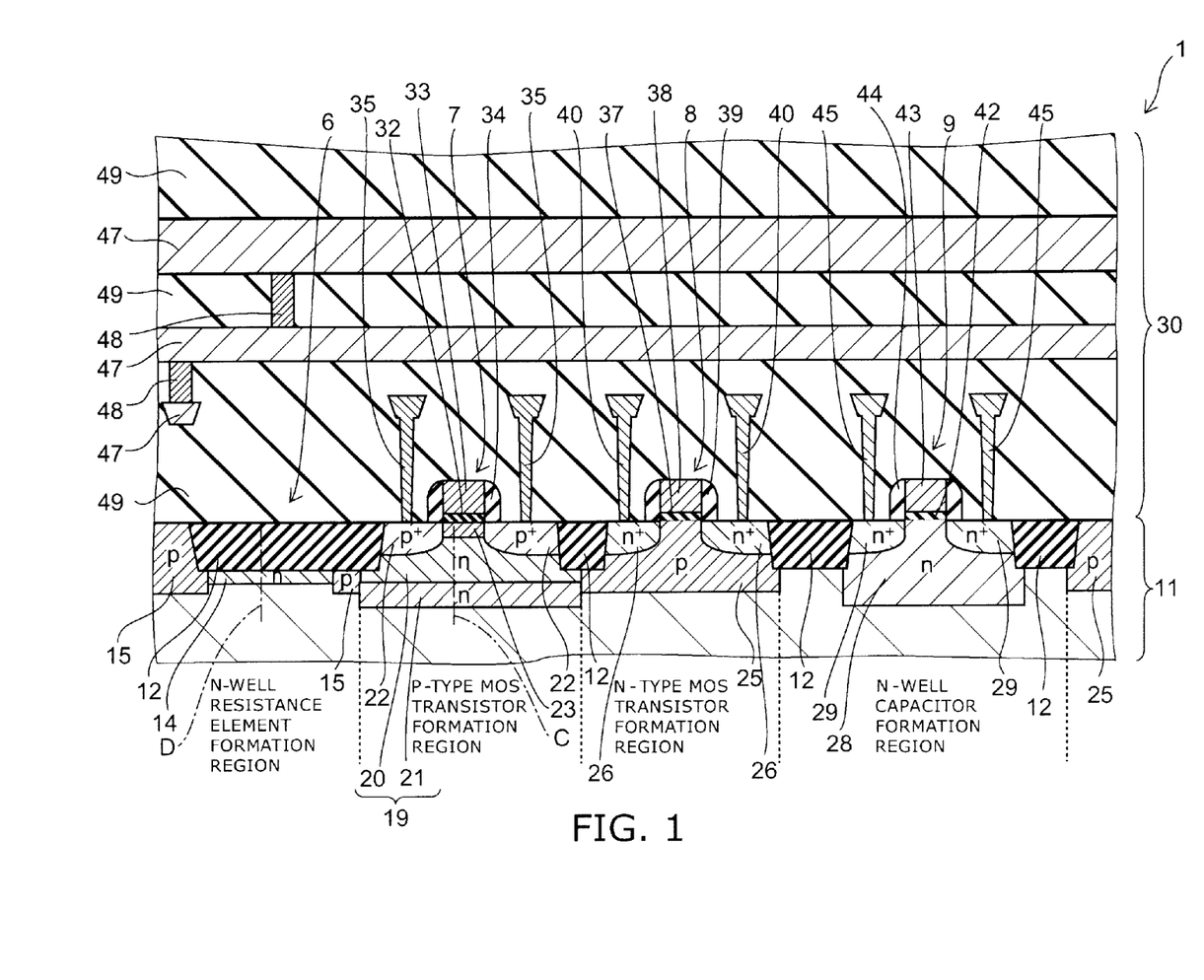
FIG. 1 is a cross-sectional view illustrating a semiconductor device according to a first embodiment.

FIG. 1 is a cross-sectional view illustrating a semiconductor device according to this embodiment.

Figure 2:
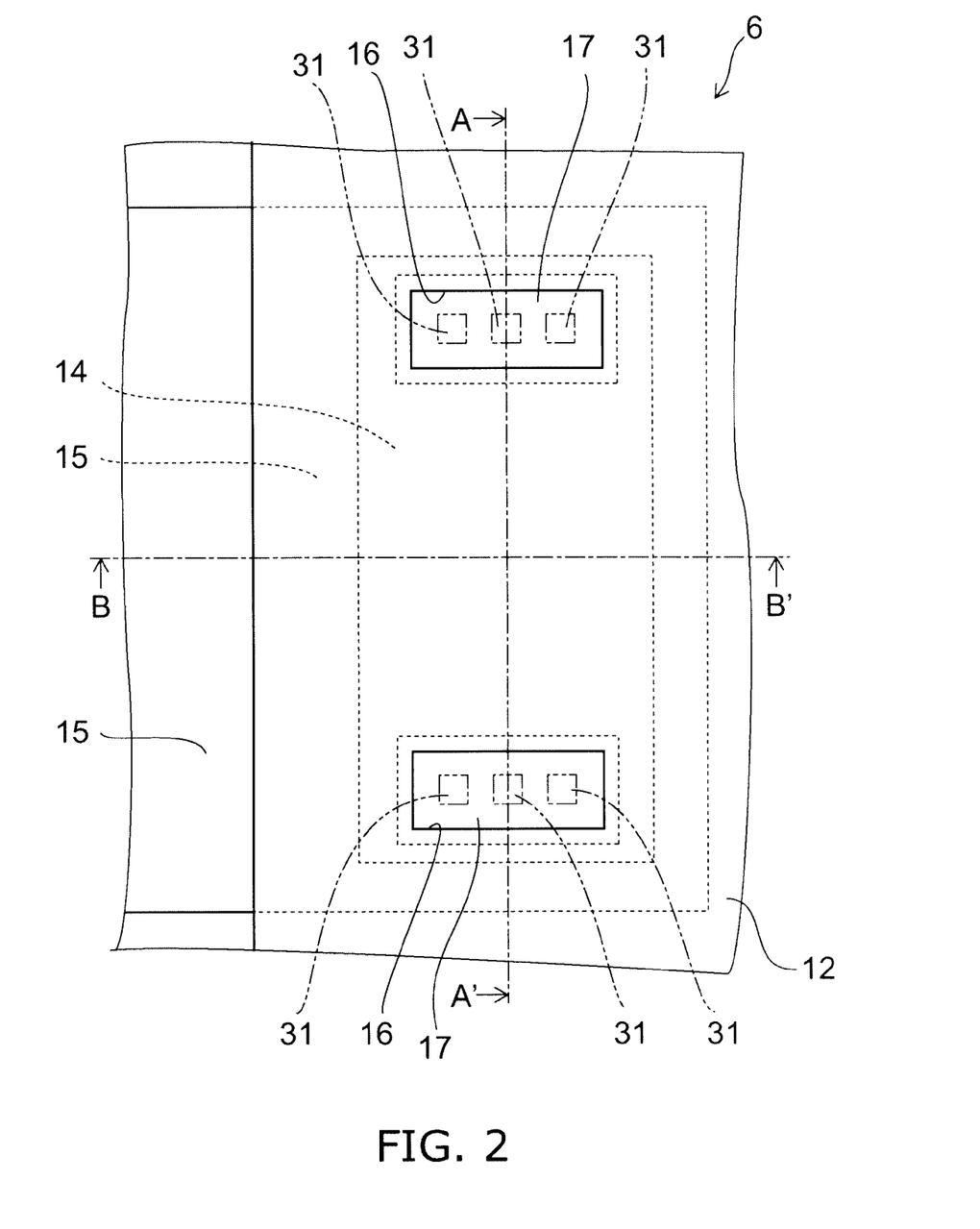
FIG. 2 is a plan view illustrating a well resistance element of the semiconductor device according to the first embodiment.

FIG. 2 is a plan view illustrating a well resistance element of the semiconductor device according to this embodiment.

Figure 3:
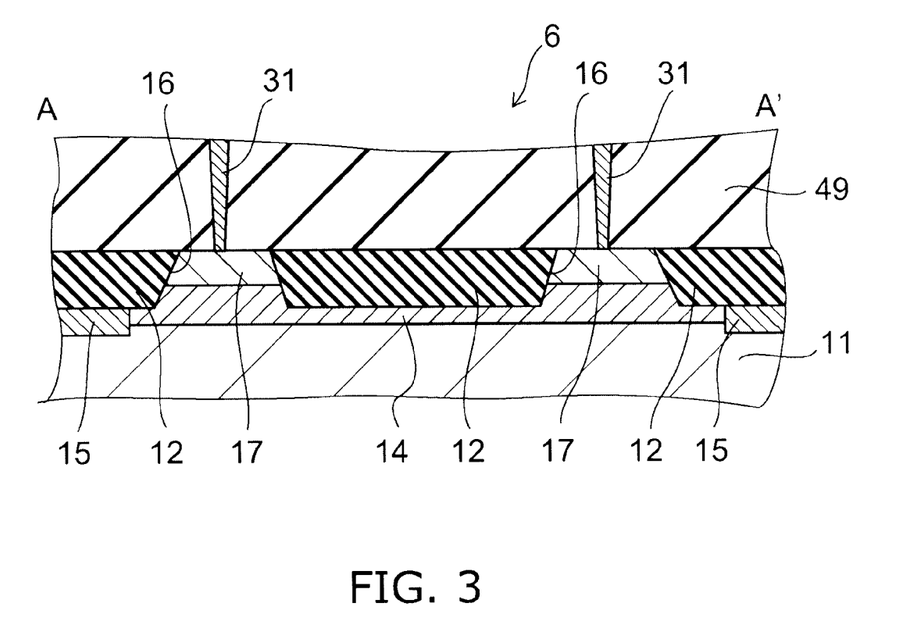
FIG. 3 is a cross-sectional view taken along A-A' line shown in FIG. 2.

FIG. 3 is a cross-sectional view taken along A-A' line shown in FIG. 2.

The cross-section of an n-well resistance element formation region shown in FIG. 1 corresponds to a cross-section along B-B' line shown in FIG. 2. FIG. 2 shows an upper surface of a silicon substrate 11. Furthermore, FIG. 2 does not show components other than the n-well resistance element.

As shown in FIG. 1, a semiconductor device 1 according to this embodiment is provided with an n-well resistance element 6, a p-type MOS transistor 7, an n-type MOS transistor 8, and an n-well capacitor 9 as functional devices. The n-well resistance element 6 is an element adding a well resistance to a circuit as a resistance. The p-type MOS transistor 7 is, for example, an enhancement-type field effect transistor with a threshold voltage of (−0.3) to (−1.5) V. The n-type MOS transistor 8 is an enhancement-type field effect transistor with a threshold voltage of 0.5 to 1.5 V. The n-well capacitor 9 is a capacitive element having a gate insulating film as a capacitive insulating film and having a gate electrode and a well as electrodes.

Assuming the MOS transistor to be enhancement-type improves a current drive performance of a CMOS (complementary metal oxide semiconductor) including the p-type MOS transistor 7 and the n-type MOS transistor 8 and reduces a through current between a source and a drain. In FIG. 1, for convenience of drawing, these functional elements are aligned in a row, however arbitrarily aligned. Hereafter, a layer structure of these functional elements is described.

In the semiconductor device 1, a silicon substrate 11 of illustratively p-type conductivity is provided and a multi-interconnection layer 30 is provided thereon. An element isolation insulating film 12 illustratively made of silicon oxide or silicon nitride is formed by STI (shallow trench isolation) in a portion of the upper layer of the silicon substrate 11. The element isolation insulating films 12 are formed in substantially whole formation region of the n-well resistance element 6 and boundary regions between respective functional elements.

As shown in FIG. 1 to FIG. 3, the n-well resistance element 6 has an n-type well 14 formed in a region immediately below the element isolation insulating film 12 in the silicon substrate 11. An upper surface of the n-type well 14 is in contact with a lower surface of the element isolation insulating film 12. The n-type well 14 is illustratively rectangular as viewed from above, namely, from the multi-interconnection layer 30 side. A frame shaped p-type well 15 is formed so as to surround the n-type well 14. An impurity concentration of the p-type well 15 is higher than an impurity concentration of the n-type well 14. A depth of the p-type well 15 is deeper than a depth of the n-type well 14. That is, a lower surface of the p-type well 15 is placed lower than a lower surface of the n-type well 15. In the specification, "impurity concentration" refers to an effective impurity concentration contributing to conductivity of semiconductor material, and for example, refers to a difference of compensation, in case both donor and acceptor are introduced into a certain region.

Two openings 16 are formed in the element isolation insulating film 12 in a region immediately above the n-type well 14. The openings 16 are disposed near both ends in a longitudinal direction of the rectangular n-type well 14 as viewed from above. An $n^+$-type contact layer 17 is formed in the opening, an upper surface of the $n^+$-type contact layer 17 is exposed to the upper surface of the silicon substrate 11, and its lower surface is in contact with the upper surface of the n-type well 14. Three contacts 31 are illustratively provided in a region immediately above the each $n^+$-type contact layer 17 in the multi-interconnection layer 30. A lower end of the contact 31 is connected to the $n^+$-type contact layer 17.

As shown in FIG. 1, an n-type well 19 is formed in the upper layer portion of the silicon substrate 11 in the formation region of the p-type MOS transistor 7. The n-type well 19 forms a channel region of the p-type MOS transistor 7. The N-type well 19 is formed to overlap a donor diffusion region 20 with a donor diffusion region 21. As described later, the donor diffusion region 20 is formed in the same impurity implantation process as the process for the n-type well 14 in the n-well resistance element 6, therefore its impurity concentration distribution is the same as an impurity concentration distribution of the n-type well 14. On the other hand, an impurity concentration of the donor diffusion region 21 is higher than an impurity concentration of the donor diffusion region 20, and a depth of the donor diffusion region 21 is deeper than a depth of the diffusion region 20. Therefore, an impurity amount contained in the n-type well 19 is more than an impurity amount contained in the n-type well 14, a depth of the n-type well 19 is deeper than the depth of the n-type well 14, and an impurity concentration at an arbitrary depth position in the n-type well 19 is higher than an impurity concentration at the same depth position in the n-type well 14. The depth of the n-type well 19 is deeper than the depth of the p-type well 15. The "depth position" refers to a position in a vertical direction with respect to the upper surface of the silicon substrate 11.

A pair of source/drain layers 22 having $p^+$-type conductivity and being mutually distal are formed in an upper layer portion of the n-type well 19. An acceptor diffusion layer 23 for adjusting a threshold voltage of the p-type MOS transistor 7 is formed in a region between the source/drain layers 22 of the n-type well 19. The acceptor diffusion layer 23 contains an impurity serving as an acceptor, thereby the p-type MOS transistor 7 is enhancement-type.

A gate insulating film 32 is provided in a region immediately above the acceptor diffusion layer 23 in the upper layer portion of the silicon substrate 11 and a gate electrode 33 is provided immediately above the region. A sidewall 34 is provided on a side surface of a gate structure having the gate insulating film 32 and the gate electrode 33 stacked. Furthermore, contacts 35 are provided in the multi-interconnection layer 30, and are connected to respective source/drain layers 22.

A p-type well 25 is formed in the upper layer portion of the silicon substrate 11 in a formation region of the n-type MOS transistor 8. The p-type well 25 forms a channel region of the n-type MOS transistor 8. As described later, the p-type well 25 is formed in the same impurity implantation process as a process for the p-type well 15 surround the n-type well 14, therefore its impurity concentration distribution is the same as an impurity concentration distribution of the p-type well 15.

The depth of the n-type well 19 in the p-type MOS transistor 7 is deeper than a depth of the p-type well 25 in the n-type MOS transistor 8. That is, a lower surface of the n-type well 19 is placed lower than a lower surface of the p-type well 25. Therefore, the depth of the p-type well 25 forming the channel region of the n-type MOS transistor 8 and the p-type well 15 of the n-well resistance element 6 is deeper than the depth of the n-type well 14 of the n-well resistance element 6 and shallower than the depth of the n-type well 19 forming the channel region of the p-type MOS transistor 7. A pair of source/drain layers 26 having $n^+$-type conductivity and being mutually distal are formed in an upper layer portion of the p-type well 25.

Furthermore, a gate insulating film 37 is provided in a region immediately above a region between the source/drain layers 26 in the silicon substrate 11, a gate electrode 38 is provided immediately above the region. A sidewall 39 is provided on a side surface of a gate structure including the gate insulating film 37 and the gate electrode 38. Furthermore, contacts 40 are provided in the multi-interconnection layer 30 and are connected to the respective source/drain layers 26.

An n-type well 28 is formed in the upper layer portion of the silicon substrate 11 in a formation region of the n-well capacitor 9. As described later, the n-type well 28 is formed in the same impurity implantation process as a process for the donor diffusion region 21 of the p-type MOS transistor 7, therefore its impurity concentration distribution is the same as an impurity concentration distribution of the donor diffusion region 21. A depth of the n-type well 28 is substantially the same as the depth of the donor diffusion region 21, and hence substantially the same as the depth of the n-type well 19. A pair of $n^+$-type contact layers 29 having $n^+$-type conductivity and being mutually distal are formed in an upper layer portion of the n-type well 28. The n-well capacitor 9 is surrounded by the p-type well 25. However, the n-type well 28 of the n-well capacitor 9 is not in contact with the p-type well 25 surrounding the n-type well 28 and isolated. The silicon substrate 11 and the element isolation insulating film 12 intervene between the n-type well 28 and the p-type well 25.

Furthermore, a gate insulating film 42 is provided in a region immediately above a region between the n+-type contact layers 29 on the silicon substrate 11, and a gate electrode 43 is provided immediately above the gate insulating film 42. A sidewall 44 is provided on a side surface of a gate structure including the gate insulating film 42 and the gate electrode 43. Furthermore, contacts 45 are provided in the multi-interconnection layer 30 and are connected to the respective n+-type contact layers 29.

A plurality of interconnections 47 are provided above the aforementioned gate insulating film, gate electrode, sidewall and contacts in the multi-interconnection layer 30 and vias 48 connecting the interconnections 47 are provided. Moreover, interlayer insulating films 49 bury those conductive members.

Hereafter, one example of the size and impurity concentration of the aforementioned each well is described. Following numerical values in the example are values after activation of impurities.

An impurity concentration of the silicon substrate 11 is illustratively $1 \times 10^{14}$ to $1 \times 10^{16}$ cm$^{-3}$. The impurity concentration of the n-type well 14 and the impurity concentration of the p-type well 15 are illustratively $1 \times 10^{15}$ to $1 \times 10^{16}$ cm$^{-3}$. A depth of the element isolation insulating film 12 is illustratively 100 to 400 nm. The depth of the n-type well 19 is illustratively 0.6 to 2.0 μm, the depth of the p-type well 15 and the depth of the p-type well 25 are illustratively 0.5 to 1.2 μm with respect to the upper surface of the silicon substrate 11. The lower surface of the n-type well 19 is placed lower than the lower surface of the p-type well 15 and the lower surface of the well 25 illustratively by 0.1 to 0.8 μm. The lower surface of the n-type well 19 is placed lower than the lower surface of the n-type well 14 illustratively by 0.4 to 1.8 μm. Moreover, the lower surface of the p-type well 15 and the lower surface of the p-type well 25 are placed lower than the lower surface of the n-type well 14 by 0.2 to 1 μm. Furthermore, the depth of the source/drain layers 22, the depth of the source/drain layers 26 and the depth of the n+-type contact layers 29 are illustratively 10 to 500 nm, and the impurity concentration of the surface is illustratively $1 \times 10^{17}$ to $1 \times 10^{21}$ cm$^{-3}$. Furthermore, a distance between the n-type well 28 of the n-well capacitor 9 and the surrounding p-type well 25 is illustratively 0.2 to 2 μm.

The "depth" of the n-type well refers to a position at which the n-type impurity concentration coincides with the p-type impurity concentration with respect to the upper surface of the silicon substrate if the silicon substrate is a p-type substrate, and the "depth" of the p-type well refers to a position at which the impurity concentration of the p-type well becomes higher than the impurity concentration of the silicon substrate in a direction from the lower surface to the upper surface of the silicon substrate if the silicon substrate is a p-type substrate. The position can be determined by measurement using, for example, SIMS (Secondary Ion-microprobe Mass Spectrometer), SCM (Scanning Capacitance Microscopy) or SSRM (Scanning Spread Resistance Microscopy) and the like.

Next, a method for manufacturing the semiconductor device according to this embodiment is described.

FIGS. 4A and 4B and FIGS. 5A and 5B are process cross-sectional views illustrating the method for manufacturing the semiconductor device according to this embodiment.

Figure 4A:
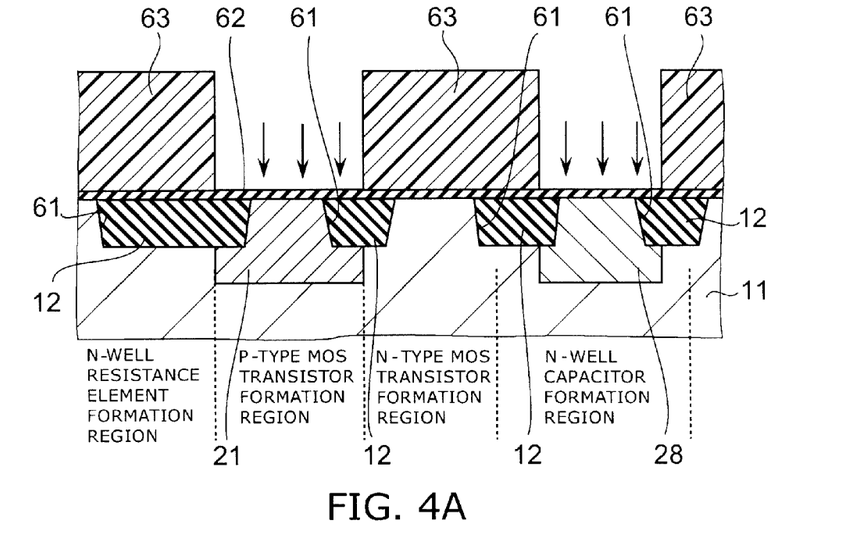
FIGS. 4A and 4B are process cross-sectional views illustrating a method for manufacturing the semiconductor device according to the first embodiment.

As shown in FIG. 4A, the silicon substrate 11 having p-type conductivity and the impurity concentration of illustratively $1 \times 10^{14}$ to $1 \times 10^{16}$ cm$^{-3}$ is prepared. N-well resistance element formation regions, p-type MOS transistor formation regions, n-type MOS transistor formation regions and n-well capacitor formation regions are configured as regions where functional elements are to be formed in the silicon substrate 11.

Trenches 61 with a depth of, for example, 100 to 400 nm are selectively formed in the upper layer portion of the silicon substrate 11 after cleaning the silicon substrate 11. The trenches 61 are formed in the substantially whole region of the n-well resistance element formation regions and boundary regions between the functional elements formation regions. Silicon oxide or silicon nitride is buried inside the trenches 61 to form the element isolation insulating films 12. A sacrificial oxide film 62 with a depth of, for example, 2 to 20 nm is formed on the upper surface of the silicon substrate 11. The sacrificial oxide film 62 is formed with an aim of reducing damages against the silicon substrate 11 accompanying with ion implantation described later, preventing the silicon substrate 11 from being contaminated and preventing the resist pattern in lithography from being collapsed.

The n-type wells of the p-type MOS transistor 7 (see FIG. 1) and the n-well capacitor 9 (FIG. 1) are formed. That is, first, a resist material is applied over the whole surface and the lithography is performed, and thereby a resist pattern 63 having the open p-type MOS transistor formation regions and the n-well capacitor formation regions is formed. Moreover, an impurity serving as a donor to silicon, for example, phosphorus (P) or arsenic (As) is ion-implanted into the silicon substrate 11 using the resist pattern 63 as a mask. The ion implantation condition at this time is assumed that an accelerating energy is illustratively 80 to 1000 keV and a dose amount is illustratively $1 \times 10^{12}$ to $1 \times 10^{14}$ cm$^{-2}$. Thereby, the donor diffusion region 21 is formed in each of the p-type MOS transistor formation regions and the n-type well 28 is formed in each of the n-well capacitor formation regions.

Figure 5A:
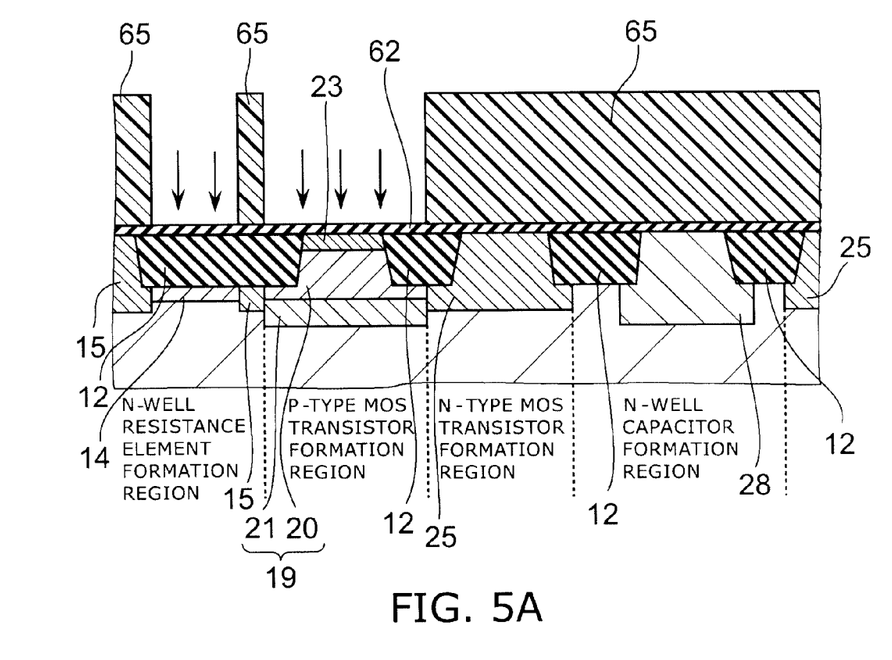
FIGS. 5A and 5B are process cross-sectional views illustrating a method for manufacturing the semiconductor device according to the first embodiment.

The impurity serving as the donor is once again ion-implanted into the p-type MOS transistor formation regions in the after-described process shown in FIG. 5A and the donor diffusion region 20 (see FIG. 5A) is overlapped to be formed, therefore the impurity concentration of the donor diffusion region 21 is desirably set to 0.5 to 0.95 times of the impurity concentration of the n-type well 19 after completed (see FIG. 1). Subsequently, the resist pattern 63 is removed by, for example, an ashing process or a process using mixed chemicals of sulfuric acid and hydrogen peroxide solution.

Figure 4B:
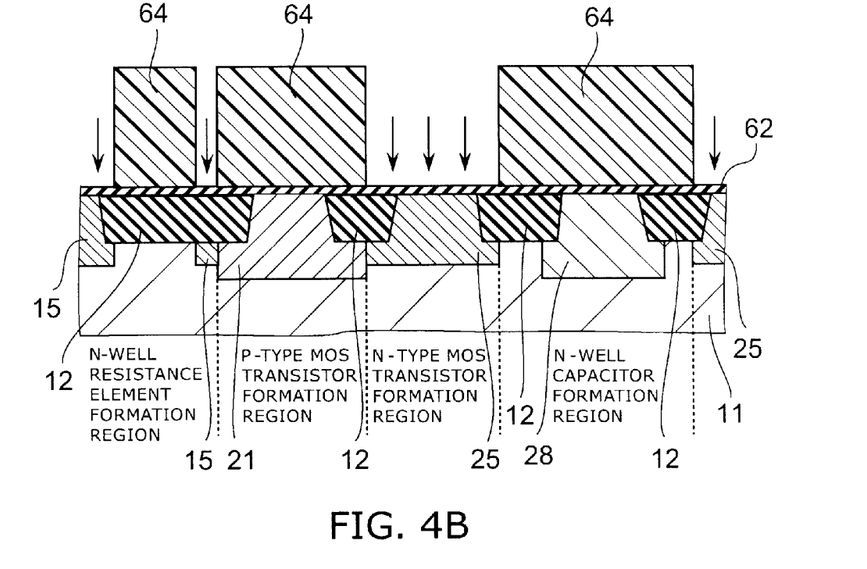

As shown in FIG. 4B, the p-type well of the n-well resistance element 6 (see FIG. 1) and the p-type well of the n-type MOS transistor 8 (see FIG. 1) are formed. The p-type well is also simultaneously formed around the n-well capacitor 9 (see FIG. 1). That is, a resist material is applied over the whole surface and the lithography is performed, and thereby a resist pattern 64 having an open periphery of each of the n-well resistance element formation regions and open surrounding areas of each of the n-type MOS transistor formation regions and each of the n-well capacitor formation regions is formed. Moreover, an impurity serving as an acceptor to silicon, for example, boron (B) or indium (In) is ion-implanted into the silicon substrate 11 using the resist pattern 64 as a mask. The ion implantation condition at this time is assumed that an accelerating energy is illustratively 50 to 800 keV and a dose amount is illustratively $1 \times 10^{12}$ to $1 \times 10^{14}$ cm$^{-2}$. Thereby, the p-type well 15 is formed around a region where the n-type well 14 (see FIG. 5A) is to be formed in each of the n-well resistance element formation regions, and the p-type well 25 is formed in each of the n-type MOS transistor formation regions. The p-type well 25 is formed to surround each of the n-well capacitor formation regions and the n-well capacitor 9 (see FIG. 1) is electrically isolated from the surrounding area. After that, the resist pattern 64 is removed.

As shown in FIG. 5A, the n-type well of the n-well resistance element 6 (see FIG. 1) is formed. At this time, the n-type well of the p-type MOS transistor 7 is over-implanted. First, a resist material is applied over the whole surface and the lithography is performed, and thereby a resist pattern 65 having the open central portion of each of the n-well resistance element formation regions and the open p-type MOS transistor formation regions is formed.

Next, the impurity serving as a donor to silicon, for example, phosphorus (P) or arsenic (As) is ion-implanted into the silicon substrate 11 using the resist pattern 65 as a mask. An impurity amount implanted at this time is less than the impurity amount implanted for formation of the aforementioned donor diffusion region 21 (see FIG. 4A) and an accelerating energy at this time is lower than the accelerating energy for forming the donor diffusion region 21. For example, the ion implantation condition in the process is assumed that the accelerating energy is illustratively 80 to 500 keV and the dose amount is illustratively $1\times10^{12}$ to $5\times10^{13}$ cm$^{-2}$. Thereby, the n-type well 14 is formed in each of regions immediately below the element isolation insulating films 12 in the central portion of each of the n-well resistance element formation regions. The donor diffusion region 20 is formed in the p-type MOS transistor formation regions. The donor diffusion region 20 is formed by overlapping with the donor diffusion region 21 formed in the aforementioned process shown in FIG. 4A and the donor diffusion regions 20 and 21 form the n-type well 19.

An impurity is implanted into the uppermost layer portion of the p-type well 19 in the p-type MOS transistor formation regions in order to adjust the threshold voltage of the p-type MOS transistor 7 (see FIG. 1). That is, the resist pattern 65 used in the aforementioned donor implantation is used as a mask as is and the impurity serving as an acceptor to silicon, for example, boron (B), boron fluoride (BF$_2$) or indium (In) is implanted into the silicon substrate 11. The ion implantation condition at this time is assumed that an accelerating energy is illustratively 5 to 20 keV and a dose amount is illustratively $2\times10^{11}$ to $1\times10^{13}$ cm$^{-2}$. Thereby, the thin acceptor diffusion layer 23 is formed in the uppermost layer portion of the n-type well 19 in each of the p-type MOS transistor formation regions. As a result, the p-type MOS transistor 8 after completed becomes enhancement-type transistor. After that, the resist pattern 65 is removed.

In case the central portion of each of the n-well resistance element formation regions is also opened in the resist pattern 65, therefore the impurity serving as the aforementioned acceptor is also implanted into the central portion of each of the n-well resistance element formation regions. However, the accelerating energy for the impurity is suppressed to be low, hence the implanted impurity remains in the element isolation insulating films 12 and does not reach the n-type well 14 immediately below the element isolation insulating films. In this way, the donor diffusion region 20 and the acceptor diffusion layer 23 can be formed using one resist pattern.

Moreover, in case the relatively deep donor diffusion region 20 is formed on ahead and the relatively shallow acceptor diffusion layer 23 is formed later, and hence the impurity contained in the acceptor diffusion layer 23 is prevented from mixing. That is, if the donor diffusion region 20 is formed after forming the acceptor diffusion layer 23, the impurity in the acceptor diffusion layer 23 is mixed by the ion implantation for forming the donor diffusion region 20 and an impurity concentration profile in the acceptor diffusion layer 23 blurs.

Furthermore, in case the n-well capacitor formation regions are covered with the resist pattern 65, and hence the acceptor implanted into the acceptor diffusion layer 23 is not implanted into the n-type well 28 of each of the n-well capacitor formation regions. Therefore, the topmost surface portion of the n-type well 28 is always accumulation under a normal drive voltage, and this allows the capacitance of the n-well capacitor 9 to be increased.

Figure 5B:
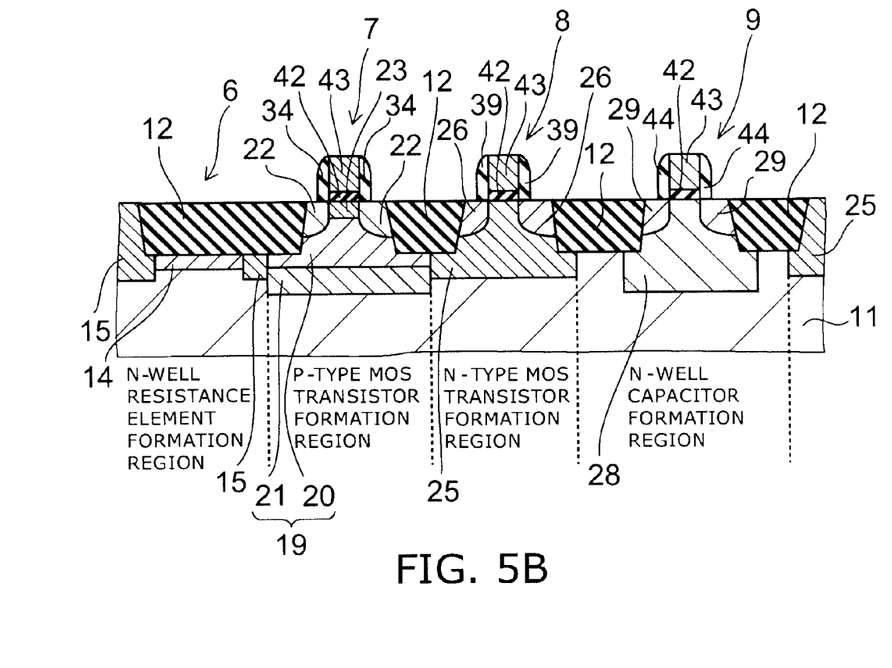

As shown in FIG. 5B, the sacrificial oxide film 62 is removed using, for example, hydrofluoric acid or ammonium fluoride solution. Next, a silicon oxide film, a silicon oxynitride film or a silicon nitride film is deposited with a thickness of, for example, 2 to 15 nm and the gate insulating film 42 is formed. Next, the gate electrode 43 is formed on the gate insulating film 42. At this time, a thickness of the gate electrode 43 is set to, for example, 10 to 500 nm. The structure of the gate electrode 43 is set to a monolayer structure made of polysilicon having an impurity, for example, phosphorus, arsenic or boron added with a concentration of $1\times10^{17}$ to $1\times10^{21}$ cm$^{-3}$ or a stacked structure made of a silicide layer such as a tungsten silicide (WSi) layer, a nickel silicide (NiSi) layer, a molybdenum silicide (MoSi) layer, a titanium silicide (TiSi) layer or a cobalt silicide (CoSi) layer and a polysilicon layer. After that, lithography and etching are performed to pattern the gate electrode 43 and the gate insulating film 42. Thereby, the gate structures stacked with the gate insulating film 42 and the gate electrode 43 are formed in the p-type MOS transistor formation regions, the n-type MOS transistor formation regions and the n-well capacitor formation regions.

A resist pattern (not shown) is formed to cover the p-type MOS transistor formation regions and to open the n-type MOS transistor formation regions and the n-well capacitor formation regions. The impurity serving as a donor to silicon, for example, phosphorus or arsenic is ion-implanted using the resist pattern and the gate structures as a mask. The condition at this time is assumed that an accelerating energy is illustratively 1 to 50 keV and a dose amount is $1\times10^{14}$ to $1\times10^{16}$ cm$^{-2}$. After that, the resist pattern is removed.

Thereby, the source/drain layers 26 are formed mutually distal in both sides of the region immediately below the gate structure in the upper layer portion of the p-type well 25 in each of the n-type MOS transistor formation regions. The n$^+$-type contact layers 29 are formed mutually distal in the upper layer portion of the n-type well 28 in each of the n-well capacitor formation regions. The source/drain layers 26 and the n$^+$-type contact layers 29 are formed in self-align to the gate structures, the depth is illustratively 10 to 500 nm and the impurity serving as a donor, for example, phosphorus, arsenic or antimony is contained so that the surface concentration is $1\times10^{17}$ to $1\times10^{21}$ cm$^{-3}$, and the conductivity is n$^+$-type.

A resist pattern (not shown) is formed to open the p-type MOS transistor formation regions and to cover the n-type MOS transistor formation regions and the n-well capacitor formation regions. The impurity serving as an acceptor to silicon, for example, boron (B), boron fluoride (BF$_2$) or indium (In) is ion-implanted using the resist pattern and the gate structures as a mask. The condition at this time is assumed that an accelerating energy is illustratively 1 to 50 keV and a dose amount is $1\times10^{14}$ to $1\times10^{16}$ cm$^{-2}$. After that, the resist pattern is removed.

Thereby, the source/drain layers 22 are formed mutually distal in both sides of the region immediately below the gate structure in the upper layer portion of the n-type well 19 in each of the p-type MOS transistor formation regions. The source/drain layers 22 are formed in self-align to the gate structure, the depth is illustratively 10 to 500 nm and the impurity serving as an acceptor, for example, boron, boron fluoride or indium is contained so that the surface concentration is $1\times10^{17}$ to $1\times10^{21}$ cm$^{-3}$, and the conductivity is p$^+$-type.

An insulating film made of, for example, silicon nitride or silicon oxynitride is deposited with a thickness of 10 to 70 nm. The insulating film is selectively removed by lithography or etching over the whole surface and is remained only on the side surfaces of each of the gate structures. This forms the sidewalls 34, 39 and 44. Next, ion implantation is performed using the sidewalls as a mask and the source/drain layers 22, 26 have a LDD (Lightly Doped Drain) structure. This improves breakdown characteristics and hot carrier characteristics of the transistors after completed. In this way, the n-well resistance element 6, the p-type MOS transistor 7, the n-type MOS transistor 8 and the n-well capacitor 9 are fabricated.

As shown in FIG. 1, the interlayer insulating films 49 are deposited on the silicon substrate 11 so as to bury the gate structures. The interlayer insulating films 49 are formed from a low dielectric material such as, for example, silicon compound of silicon oxide or silicon nitride and the like, silicate glass of BPSG (boron phosphorous silicate glass) or PSG (phospho silicate glass) and the like, HSG (hydrogen silisequioxane) or MSQ (methyl silsequioxane) and the like. The film thickness is set to, for example, 10 to 1000 nm.

Contact holes are formed in order to bury contacts 31, 35, 40, 45 in the interlayer insulating films 49 by lithography and anisotropic etching. Next, trenches are formed in a region where the interconnections 47 in the upper surface of the interlayer insulating films 49 are to be formed by once again performing the lithography and the anisotropic etching. After that, barrier metal such as titanium (Ti), tantalum (Ta), titanium nitride (TiN) or tantalum nitride (TaN) and the like is deposited on inner surfaces of the contact holes and the trenches with a thickness, for example, of 1 to 100 nm by, for example, sputtering or CVD (chemical vapor deposition). Next, metal material such as tungsten (W), aluminum (Al) or copper (Cu) and the like is deposited with a thickness of, for example, 10 to 1000 nm and insides of contact holes and trenches are buried. Subsequently, the upper surface is planarized by planarization process such as CMP (chemical mechanical polishing) and the like and the metal material and the barrier metal are removed from portions other than the insides of the contact holes and the trenches. This forms the contacts 31, 35, 40 and 45, and the interconnections 47.

Afterward, similarly, the interlayer insulating films are formed, via holes and trenches used for interconnections are formed by the lithography and the anisotropic etching, the barrier metal is deposited on the inner surface of the via holes and the trenches, the insides of the via holes and the trenches are buried with the metal material, the planarization process is repeated, the interconnection layer buried with the interconnections 47 and the vias 48 is formed layer by layer in the interlayer insulating films 49 and then the multi-interconnection layer 30 is fabricated. The anisotropic etching for the interlayer insulating films is performed under a condition having a selective ratio to the resist pattern, the metal material buried in the lower layer contacts and vias, and the barrier metal. In stead of a method for forming the interconnection made of tungsten, aluminum or copper by the above damascene process, the interconnections may be formed by a method of depositing a metal film made of aluminum (Al) or aluminum-copper alloy (AlCu) over the whole surface and subsequently patterning the metal film in interconnection shape by etching. In this way, the semiconductor device 1 according to this embodiment is manufactured.

Next, operation and effects of this embodiment is described.

In this embodiment, the donor diffusion region 21 is formed in the process shown in FIG. 4A, the n-type well 14 and the donor diffusion region 20 are formed in the process shown in FIG. 5A and the n-type well 19 is formed by over-implantation to the donor diffusion regions 21 and 20. This allows the depth and impurity concentration of the n-type well 19 forming the channel of the p-type MOS transistor 7 to be designed independently from the depth and impurity concentration of the n-type well 14 of the n-well resistance element 6. As a result, the depth of the n-type well 19 can be deeper than the depth of the n-type well 14 and the impurity concentration at an arbitrary depth position of the n-type well 19 can be higher than the impurity concentration at the same depth position of the n-type well 14.

Figure 6:
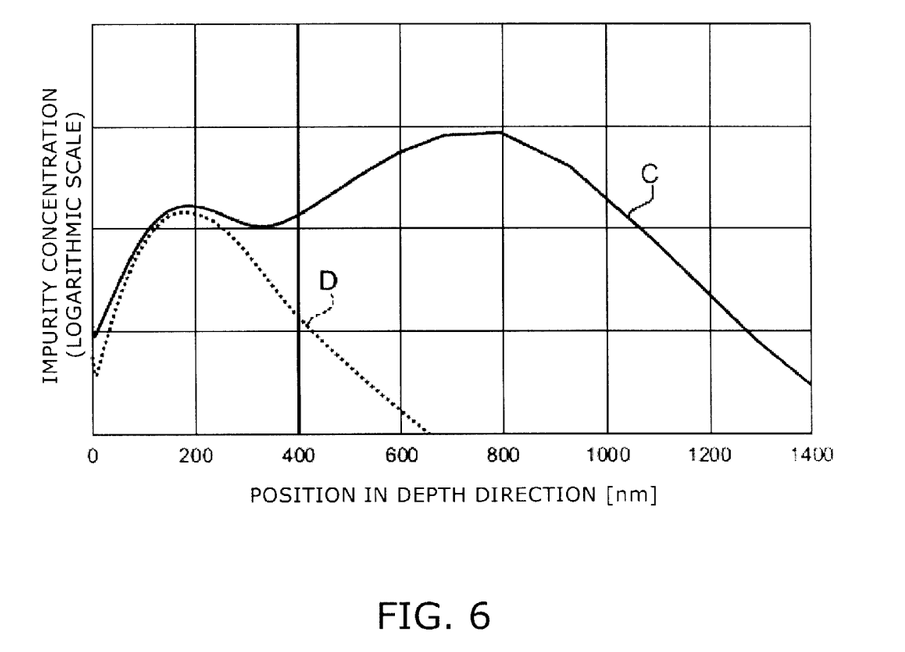
FIG. 6 is a graph view illustrating an impurity concentration profile, where a horizontal axis indicates a depth position and a vertical axis indicates an n-type impurity concentration.

FIG. 6 is a graph view illustrating an impurity concentration profile along the lines C and D shown in FIG. 1, where a horizontal axis indicates a depth position and a vertical axis indicates an n-type impurity concentration.

The impurity concentration profile shown in FIG. 6 is a result of calculating the impurity concentration in respective portions by simulating the method for manufacturing according to this embodiment and virtually manufacturing a semiconductor device. The "position in depth direction" shown on the horizontal axis of FIG. 6 refers to a distance from the surface of the silicon substrate 11. The depth of the element isolation insulating films 12 is illustratively 100 to 400 nm.

The solid line C shown in FIG. 6 shows the impurity concentration profile along the line C shown in FIG. 1, namely, the impurity concentration profile of the n-type well 19 of the p-type MOS transistor 7. The broken line D shown in FIG. 6 shows the impurity concentration profile along the line D shown in FIG. 1, namely, the impurity concentration profile of the n-type well 14 of the n-well resistance element 6.

As shown in FIG. 6, the impurity concentration at an arbitrary depth position in the n-type wells 19 (solid line C) is higher than the impurity concentration at the same depth position in the n-type wells 14 (solid line D).

As a result, latch-up characteristics can be improved by increasing the impurity concentration in the channel region to decrease a resistance of the channel region of the p-type MOS transistor 7. On the other hand, the shallow n-type well 14 having low impurity concentration is formed in the n-well resistance element 6, and then a resistivity per unit area is increased, thereby while ensuring a prescribed resistance, an area of the n-type well 14 can be small. This enables the semiconductor device 1 to simultaneously achieve shrinking of the n-well resistance element 6 and improvement of the latch-up characteristics.

According to this embodiment, the n-type well 14 can be designed independently from the n-type well 19, therefore the n-type well 14 can be formed shallower than the p-type well 15. Thereby, the n-type well 14 can be effectively isolated from the surrounding by the n-type well 15. Consequently, the width of the n-type well 15 can be thin and the n-well resistance element 6 can be further shrunk. Particularly, in case a plurality of the n-well resistance elements 6 are disposed adjacently, a width of a boundary region forming the p-type well 15 can be reduced, while preventing punch through between a plurality of the n-type wells 14. For example, in this embodiment, the lower surface of the n-type well 14 is placed lower than the lower surface of the p-type well 15 by 0.2 to 1 μm, therefore even if the distance between the n-type wells 14, namely, the width of the p-type well 15 is reduced to 1 to 2 μm, the punch through between the n-type wells 14 can be prevented.

Furthermore, in this embodiment, the n-type well 19 of the p-type MOS transistor 7 is formed deeper than the p-type well 15 of the n-well resistance element 6 and the p-type well 25 of the n-type MOS transistor 8, thus the p-type well 15 can be effectively isolated from the p-type well 25 by the n-type well 19. Thereby, even if the n-well resistance element 6 and the n-type MOS transistor 8 are disposed at positions sandwiching the p-type MOS transistor 7, the n-well resistance element 6 can be reliably isolated from the n-type MOS transistor 8. Conversely, if the n-type well 19 is formed shallower than the p-type wells 15 and 25, there is a possibility that electrical isolation between the p-type well 15 and the p-type well 25 becomes poor dependent on disposition of the functional elements because of the p-type conductivity of the silicon substrate 11. Thus, the disposition of the functional elements is restricted.

Furthermore, in this embodiment, ion implantation is performed twice using one resist pattern 65 and the n-type well 14 and the acceptor diffusion layer 23 are formed in the process shown in FIG. 1. This enables the number of lithography having high load in process to be decreased and the manufacturing cost to be reduced. At this time, use of different accelerating energies in two ion implantation processes makes implantation depths different, therefore the impurity implanted to form the acceptor diffusion layer 23 stops in the element isolation insulating films 12 in each of the n-well resistance element formation regions and does not reach the n-type well 14. Consequently, the ion implantation for forming the acceptor diffusion layer 23 does not reduce the resistivity of the n-type well 14. On the other hand, the impurity implanted to form the n-type well 14 are also implanted into the p-type MOS transistor formation regions to form the donor diffusion region 20. As a result, the source/drain breakdown voltage of the p-type MOS transistors 7 is improved.

Next, a comparative example of this embodiment is described.

FIGS. 7A and 7B, FIGS. 8A and 8B are process cross-sectional views illustrating a method for manufacturing a semiconductor device according to the example.

Figure 7A:
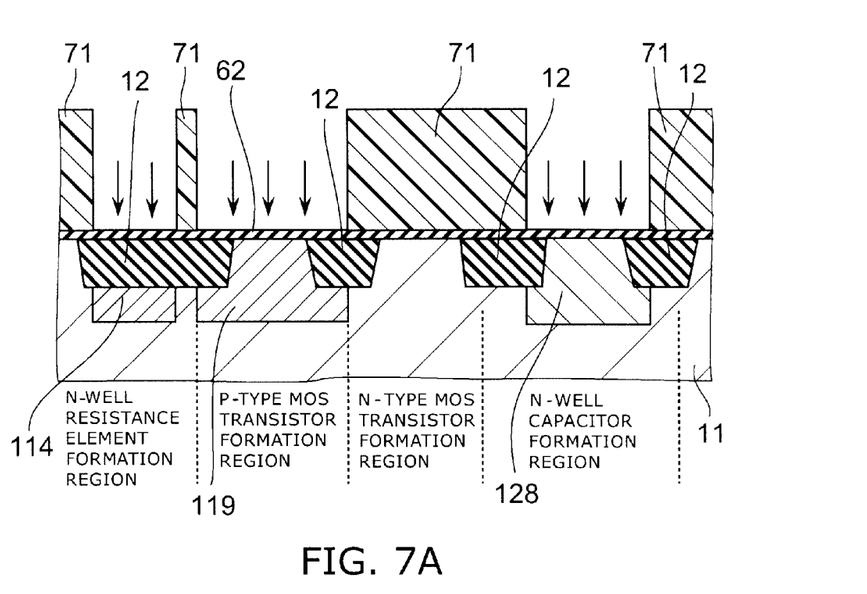
FIGS. 7A and 7B are process cross-sectional views illustrating a method for manufacturing a semiconductor device according to a comparative example of the first embodiment.

As shown in FIG. 7A, the element isolation insulating films 12 are formed in the upper layer portion of the silicon substrate 11. Next, the sacrificial film 62 is formed on the upper surface of the silicon substrate 11.

Next, a resist pattern 71 is formed to cover the periphery of each of the n-well resistance element formation regions and the n-type MOS transistor formation regions and to open the central portion of each of the n-well resistance element formation regions, the p-type MOS transistor formation regions and the n-well capacitor formation regions. The impurity serving as a donor to silicon, for example, phosphorus or arsenic is ion-implanted using the resist pattern 71 as a mask. The condition at this time is assumed that an accelerating energy is illustratively 80 to 1000 keV and a dose amount is $1\times10^{12}$ to $1\times10^{14}$ cm$^{-2}$. Thereby, n-type well 114 is formed in a region immediately below the element isolation insulating films 12 in the central portion of each of the n-well resistance element formation regions, n-type well 119 is formed in each of the p-type MOS transistor formation regions and n-type well 128 is formed in each of the n-well capacitor formation regions. After that, the resist pattern 71 is removed.

Figure 7B:
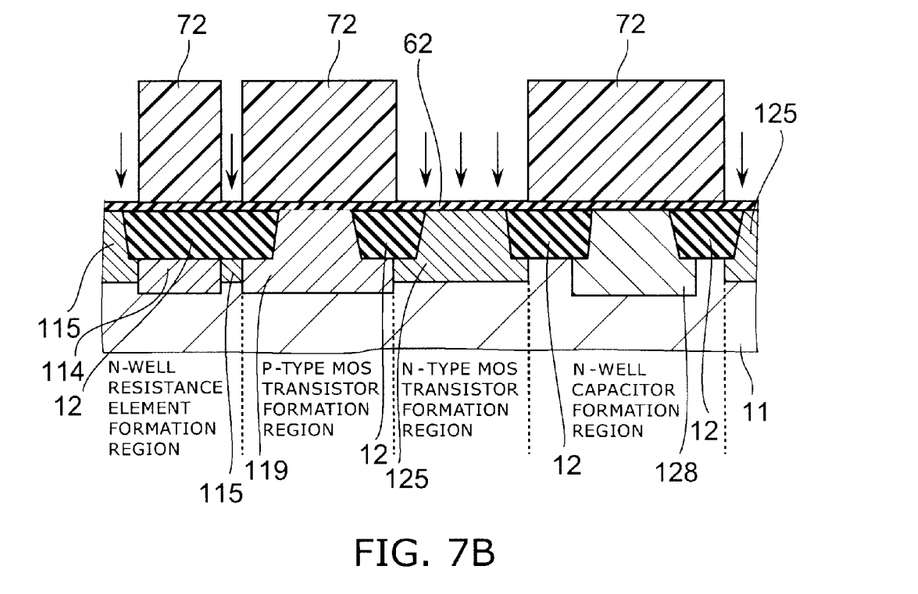

As shown in FIG. 7B, a resist pattern 72 is formed to cover the central portion of each of the n-well resistance element formation regions, the p-type MOS transistor formation regions and the n-well capacitance formation regions and to open the periphery of each of the n-well resistance element formation regions and the n-type MOS transistor formation regions. The impurity serving as an acceptor to silicon, for example, boron or indium is ion-implanted using the resist pattern 72 as a mask. The condition at this time is assumed that an accelerating energy is illustratively 50 to 800 keV and a dose amount is $1\times10^{12}$ to $1\times10^{14}$ cm$^{-2}$. Thereby, the p-type well 115 is formed in each of the n-well resistance element formation regions and the p-type well 125 is formed in each of the n-type MOS transistor formation regions. The p-type well 125 is formed to surround each of the n-well capacitor formation regions. After that, the resist pattern 72 is removed.

Figure 8A:
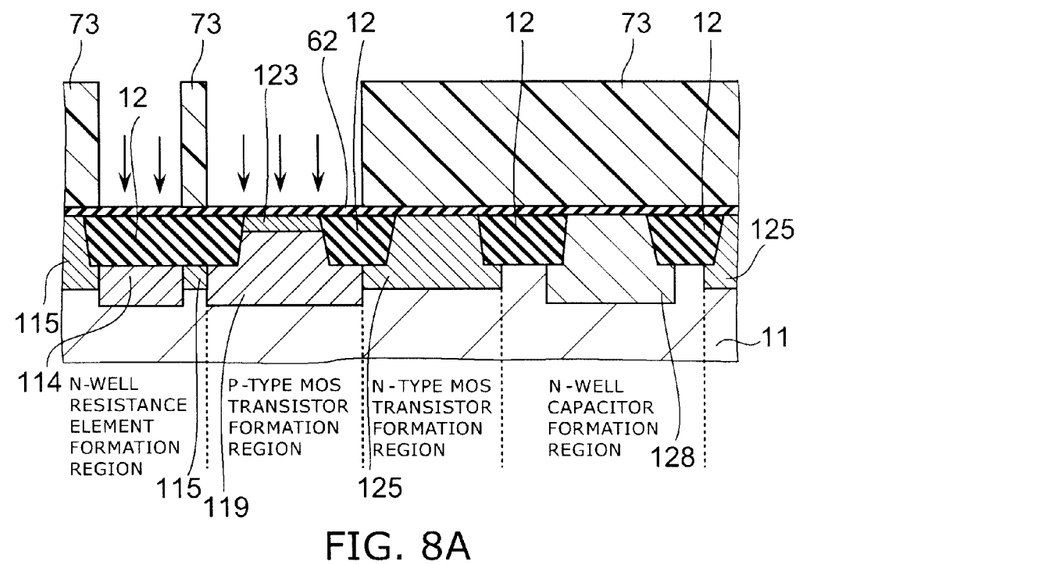
FIGS. 8A and 8B are process cross-sectional views illustrating the method for manufacturing the semiconductor device according to the comparative example.

As shown in FIG. 8A, a resist pattern 73 is formed to cover the n-type MOS transistor formation regions and the n-well capacitor formation regions and to open the central portion of the n-well resistance element formation regions and the p-type MOS transistor formation regions. Next, the impurity serving as an acceptor to silicon, for example, boron (B), boron fluoride (BF$_2$) or indium (In) is ion-implanted into the silicon substrate 11 using the resist pattern 73 as a mask. The condition at this time is assumed that an accelerating energy is illustratively 5 to 20 keV and a dose amount is $2\times10^{11}$ to $1\times10^{13}$ cm$^{-2}$. Thereby, acceptor diffusion layer 123 is formed in the uppermost layer portion of the n-type well 119 in each of the p-type MOS transistor formation regions. Consequently, the p-type MOS transistor after completed becomes enhancement-type transistor. After that, the resist pattern 73 is removed.

Figure 8B:
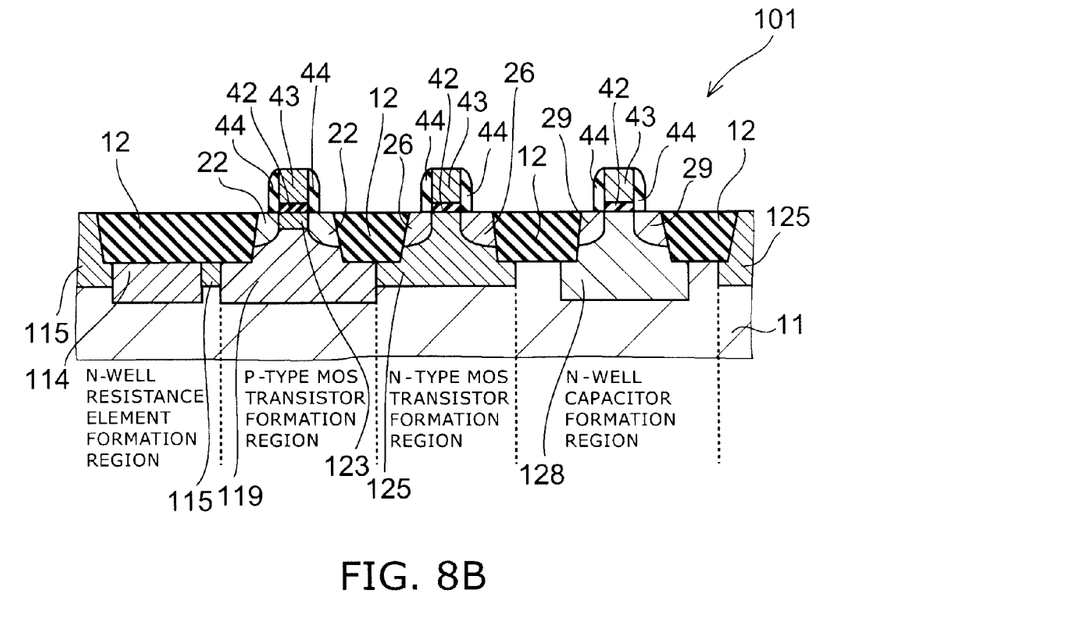

As shown in FIG. 8B, a semiconductor device 101 according to the example is manufactured by forming the gate structures and the source/drain layers and then forming the multi-interconnection layer using a similar way to the aforementioned embodiment.

In the example, the n-type well 114 of the n-well resistance element is formed simultaneously with the n-type well 119 of the p-type MOS transistor and the n-type well 128 of the n-well capacitor. Thus, the depth and the impurity concentration of the n-type well 114 cannot be designed independently from the depth and the impurity concentration of the n-type wells 119 and 128. Consequently, if the impurity concentration of the n-type well 114 is reduced and the resistivity is increased in order to shrink the n-well resistance element, the resistivity of the n-type well 118 serving as the channel region of the p-type MOS transistor also increases. Thereby, electrons generated with operation of the p-type MOS transistor are stored in the n-type well 119 and a junction interface between the n-type well 119 and the p-type well 125 is biased in a forward direction. As a result, a parasite transistor including the n-type well 119, the p-type well 125 and the source/drain layers 22 is likely to turn on and latch-up is likely to occur.

Moreover, preventing the latch-up may be achieved by shortening a distance from a well contact (not shown) of the n-type well 119 to the transistor, however it increases an interconnection area for the well contact. Then a whole area of the semiconductor device 101 increases. Furthermore, the impurity concentration of the n-type well 119 is determined according to a performance required to the n-well resistance element, thus a characteristics of the p-type MOS transistor in a back bias cannot be controlled independently. On the other hand, if the impurity concentration of the n-type well 114 is increased in order to improve the latch-up characteristics, the impurity concentration of the n-type well 114 is also increased and the resistivity is decreased. As a result, the size of the n-well resistance element increases.

Furthermore, in the example, the depth of the n-type well 114 becomes equal to the depth of the n-type well 119, thus causing the n-type well 114 to be formed deeper than the n-type well 115. Consequently, for example, when a plurality of n-type resistance elements are disposed adjacent each other, shortening a distance between the n-type wells 114 causes the punch-through to be occurred between the n-type wells 114. Specifically, if the distance between the n-type wells 114 is reduced not more than, for example, 2 μm, the punch-through is likely to occur. Thus, the width of the p-type well 115 intervening between the n-type wells 114 broadens in order to prevent the punch-through, and the size of the n-type resistance element increases.

Furthermore, in the comparative example, in order to design the n-type well 114 independently from the n-type well 119, the ion implantation is performed for forming the wells using different patterns, respectively, resulting in increase of the number of lithography processes having a high process load by one time. Therefore, a manufacturing cost of the semiconductor device 101 increases.

In contrast, as described above, according to this embodiment, the n-well resistance element 6, the p-type MOS transistor 7, the n-type MOS transistor 8 and the n-type well capacitor 9 can be designed in lithography processes of the same number of times as those of the example, and the n-type well 14 of the n-well resistance element 6 can be designed independently from the n-type well 19 of the p-type MOS transistor 7, therefore the small size n-well resistance element 6 can be compatible with the p-type MOS transistor 7 with excellent latch-up characteristics.

This embodiment can be preferably applied to a semiconductor device including a transistor operational under a low supply voltage, and applied to a semiconductor device to shrink a resistance element. For example, this embodiment can be preferably used for a ReRAM (Resistance Random Access Memory) storing data by using a variable resistance material changing resistivity largely depending on an applied voltage and its history. Hereinafter, the application of the semiconductor device according to the first embodiment to the ReRAM is illustrated as a second embodiment of the invention.

The second embodiment is described.

Figure 9:
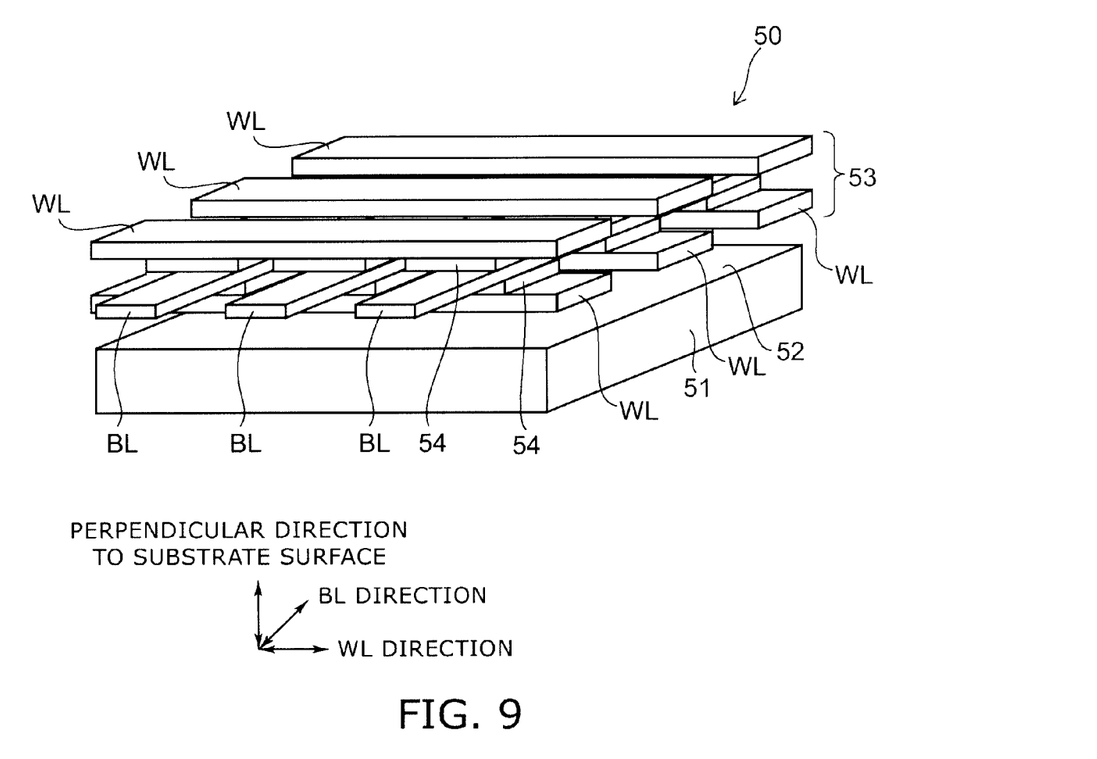
FIG. 9 is a perspective view illustrating a semiconductor device according to a second embodiment.

FIG. 9 is a perspective view illustrating the semiconductor device (ReRAM) according to this embodiment.

As shown in FIG. 9, a ReRAM 50 according to this embodiment is provided with a silicon substrate 51 and a drive circuit 52 is formed on an upper surface of the silicon substrate 51. As described later, the drive circuit is provided multiply. A memory cell array 53 is provided on the silicon substrate 51. A plurality of memory cells 54 are arranged in a three-dimensional matrix configuration in the memory cell array 53.

The drive circuit 52 is a circuit performing programming, erasing and reading data to and from one of the memory cells 54 forming the memory cell array 53, and serves as a CMOS circuit operating under a low supply voltage of, for example, 1 to 5V in order to reduce a power consumption. Specifically, the drive circuit 52 includes the n-well resistance element 6, the p-type MOS transistor 7, the n-type MOS transistor 8 and the n-well capacitor 9 described in the above first embodiment. The configuration of the elements is the same as that of the above first embodiment.

The memory cell array 53 has word line interconnection layers including a plurality of word lines WL extending in one direction (WL direction) parallel to the upper surface of the silicon substrate 51 alternately stacked with bit line interconnection layers including a plurality of bit lines parallel to the upper surface of the silicon substrate 51 and extending in a direction (BL direction) perpendicular to the WL direction. The respective memory cells 54 are provided every nearest neighbor portion of respective word lines WL and respective bit lines BL. The respective memory cells 54 are connected between respective word lines WL and the respective bit lines BL, and a variable resistance film (not shown) is provided so as to intervene in its current path.

Specifically, the plurality of memory cells 54 are arranged in a two dimensional matrix between one of the word lines WL in a first one of the word line interconnection layers as viewed from the silicon substrate 51 side and one of the bit lines BL in a first one of the bit line interconnection layers provided thereon. The plurality of memory cells 54 are arranged in a two dimensional matrix between one of the bit lines BL in the first one of the bit line interconnection layers and one of the word lines WL in a second one of the word line interconnection layers provided thereon. Hereinafter, in a similar way, the plurality of memory cells 54 arranged in a two dimensional matrix are stacked multiply and form a three dimensional stacked structure. Here, in FIG. 9, in convenience, only two layers word line interconnection layers and one layer bit line interconnection layer are shown, however more word line interconnection layers and bit line interconnection layers are stacked.

Moreover, the ReRAM 50 includes the memory cell array 53 divided into a plurality of blocks along directions parallel to the upper surface of the silicon substrate 51, for example, the WL direction and BL direction, the drive circuit 52 is provided in every block. The each drive circuit 52 drives respective blocks. In this case, the drive circuit driving respective blocks is disposed immediately below its block in order to simplify a layout of the ReRAM 50 and a resistance element of the each drive circuit to be shrunk in order to accommodate the each drive circuit immediately below the respective blocks. In this way, the drive circuit of the ReRAM requires both of a transistor operable under the low supply voltage and a small size resistance element. Moreover, this embodiment can meet this requirement. Particularly, the memory cell array of the ReRAM can reduce a plane area per one memory cell by taking the memory cell array 53 as a three dimensional structure. Thus, the transistors of ReRAM are operated under the low supply voltage and a size of the resistance element of ReRAM is shrunk.

As described above, the invention has been described with reference to embodiments, however the invention is not limited to the embodiments. That is, any addition, deletion, or design change of components, or any addition, omission, or condition change of processes in the above embodiments suitably made by those skilled in the art are also encompassed within the scope of the invention as long as they fall within the spirit of the invention. In the above second embodiment, the application of the invention to the ReRAM is exemplified, however is not limited thereto. For example, the invention can also be applied to semiconductor memories such as an FeRAM (Resistance Random Access Memory) and an MRAM (Magnetic Random Access Memory) or the like other than the ReRAM.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:
1. A semiconductor device comprising:
a semiconductor substrate;
a resistance element of a first conductivity type formed in one region of the semiconductor substrate;

a field effect transistor of a second conductivity type formed in another region of the semiconductor substrate; and a field effect transistor of the first conductivity type formed in still another region of the semiconductor substrate, the resistance element including:
- an insulating film formed in an upper layer portion of the semiconductor substrate; and
- a well of the first conductivity type formed immediately below the insulating film, an impurity concentration at an arbitrary depth position in the well of the first conductivity being lower than an impurity concentration at the same depth position in a channel region of the field effect transistor of the second conductivity type.

2. The device according to claim 1, further comprising, a well of the second conductivity type formed in a periphery of the well of the first conductivity type.

3. The device according to claim 2, wherein an impurity concentration of the well of the second conductivity type is higher than an impurity concentration of the well of the first conductivity type.

4. The device according to claim 2, wherein a depth of a channel region of the field effect transistor of the first conductivity type and the well of the second conductivity type is deeper than a depth of the well of the first conductivity type and shallower than a depth of the channel region of the field effect transistor of the second conductivity type.

5. The device according to claim 2, wherein a depth of a channel region of the field effect transistor of the first conductivity type and the well of the second conductivity type is deeper than a depth of the well of the first conductivity type.

6. The device according to claim 2, wherein a depth of a channel region of the field effect transistor of the first conductivity type and the well of the second conductivity type is shallower than a depth of the channel region of the field effect transistor of the second conductivity type.

7. The device according to claim 1, wherein a depth of the channel region of the field effect transistor of the second conductivity type is deeper than a depth of the well of the first conductivity type.

8. The device according to claim 1, wherein the field effect transistor of the second conductivity type and the field effect transistor of the first conductivity type are enhancement type transistors.

9. The device according to claim 1, further comprising:
a capacitor formed in a capacitor formation region of the semiconductor substrate,
the capacitor including:
- another well of the first conductivity type formed in the upper layer portion of the semiconductor substrate;
- a gate insulating film provided immediately above the another well; and
- a gate electrode provided immediately above the gate insulating film.

10. The device according to claim 9, wherein a depth of the another well is equal to a depth of the channel region of the field effect transistor of the second conductivity type.

11. The device according to claim 1, further comprising:
a memory cell array provided on the semiconductor substrate and divided into a plurality of blocks along a direction parallel to an upper surface of the semiconductor substrate,
the resistance element being provided in each of the blocks,
the resistance element being disposed immediately below the each of the blocks corresponding thereto.

12. The device according to claim 11, wherein the memory cell array includes a plurality of memory cells, each of the memory cells includes a variable resistance film.

13. A method for manufacturing a semiconductor device comprising:
forming an insulating film in an upper layer portion of one region of a semiconductor substrate;
implanting impurity into an another region with the insulating film not formed of the semiconductor substrate to form a first diffusion region of a first conductivity type in the another region;
implanting impurity into still another region with the insulating film not formed of the semiconductor substrate to form a well of a second conductivity type in the still another region;
implanting impurity into the one region and the another region to form a well of the first conductivity type immediately below the insulating film and to form a second diffusion region of the first conductivity type in the another region with overlapping the first diffusion region;
forming a gate insulating film at least in a portion on the first diffusion regions and at least in a portion of the well of the second conductivity type;
forming a gate electrode on the gate insulating film;
forming source/drain regions of the second conductivity type in a portion of the first diffusion region; and
forming source/drain regions of the first conductivity type in the portion of the well of the second conductivity type.

14. The method according to claim 13, further comprising:
implanting adjusting a threshold value impurity into the another region after the forming the well of the first conductivity type and the second diffusion region of the first conductivity type.

15. The method according to claim 14, wherein the adjusting a threshold value impurity is performed using a mask used for the implantation of impurity in the forming the well of the first conductivity type and the second diffusion region of the first conductivity type,
an accelerating energy of adjusting a threshold value impurity is lower than an accelerating energy of the implantation of impurity in the forming the well of the first conductivity type and the second diffusion region of the first conductivity type.

16. The method according to claim 13, wherein another well of the first conductivity type is formed in a capacitor formation region by implanting the impurity also into the capacitor formation region in the forming the first diffusion region of the first conductivity and the well of the second conductivity type,
a gate insulating film is also formed on the another well in the forming the gate insulating film,
a gate electrode is also formed immediately above the another well in the forming the gate electrode.

17. The method according to claim 13, wherein an implantation amount of the impurity in the forming the well of the first conductivity type and the second diffusion region is lower than an implantation amount of the impurity in the forming the first diffusion region and an implantation amount of the impurity in the forming the well of the second conductivity type.

* * * * *